(12) United States Patent
Pollmann-Retsch

(10) Patent No.: US 9,559,490 B2
(45) Date of Patent: Jan. 31, 2017

(54) COOLING DEVICE FOR COOLING A LASER ARRANGEMENT AND LASER SYSTEM COMPRISING COOLING DEVICES

(71) Applicant: KONINKLIJKE PHILIPS N.V., Eindhoven (NL)

(72) Inventor: Jens Pollmann-Retsch, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/787,691

(22) PCT Filed: Apr. 30, 2014

(86) PCT No.: PCT/EP2014/058828
§ 371 (c)(1),
(2) Date: Oct. 28, 2015

(87) PCT Pub. No.: WO2014/177616
PCT Pub. Date: Nov. 6, 2014

(65) Prior Publication Data
US 2016/0118768 A1    Apr. 28, 2016

(30) Foreign Application Priority Data

May 2, 2013 (EP) .................................... 13166176

(51) Int. Cl.
*H01S 3/04* (2006.01)
*H01S 5/024* (2006.01)
(Continued)

(52) U.S. Cl.
CPC ............. *H01S 5/02423* (2013.01); *F28F 7/02* (2013.01); *F28F 9/26* (2013.01); *H01L 23/473* (2013.01);
(Continued)

(58) Field of Classification Search
CPC ............. H01S 5/02423; H01S 5/02208; H01S 5/02248; H01S 5/423; F28F 7/02; F28F 9/26; F28F 2275/14; H01L 23/473; H01L 23/3735; H01L 2924/0002; F28D 2021/0028
See application file for complete search history.

(56) References Cited

U.S. PATENT DOCUMENTS 5,311,530 A   5/1994  Wagner et al.
5,835,345 A   11/1998 Staskus et al.
(Continued)

FOREIGN PATENT DOCUMENTS

CN   201374498 Y   12/2009
DE   29716405 U1   1/1999
(Continued)

*Primary Examiner* — Yuanda Zhang

(57) ABSTRACT

The invention describes a cooling device (100) for cooling a laser arrangement and a laser system comprising at least two of such cooling devices (100). The invention further describes a method of manufacturing the cooling device (100) and the laser system. The cooling device (100) comprises a mounting area for the laser arrangement, a cooling volume (140) comprising cooling channels being arranged to cool the mounting area (105), a coolant inlet and a coolant outlet (150,145) being connected to the cooling channels of the cooling volume (140), a first coolant supply through hole (110) being connected to the coolant inlet (150), a second coolant supply through hole (111) being connected to the coolant outlet (145). The cooling device (100) further comprises at least one coupling element (115, 130, 135) enabling a detachable interconnection to a second cooling device (100) such that upon interconnecting the cooling device (100) to the second cooling device (100), the first coolant supply through hole (110) of the cooling device (100) being connected to a first coolant supply through hole of the second cooling device (100) and the second coolant supply (Continued)

through hole (111) of the cooling device (100) being connected to a second coolant supply through hole of the second cooling device (100), wherein the cooling device (100) being arranged in a way that a coolant can be supplied to the cooling volume via the first coolant supply through hole (110) and the second coolant supply through hole (111). The cooling device (100) enables a cost effective and scalable laser system.

19 Claims, 8 Drawing Sheets

(51) Int. Cl.
*H01L 23/473* (2006.01)
*H01S 5/42* (2006.01)
*F28F 7/02* (2006.01)
*F28F 9/26* (2006.01)
*H01S 5/022* (2006.01)
*H01L 23/373* (2006.01)
*F28D 21/00* (2006.01)

(52) U.S. Cl.
CPC ....... *H01S 5/02208* (2013.01); *H01S 5/02248* (2013.01); *H01S 5/423* (2013.01); *F28D 2021/0028* (2013.01); *F28F 2275/14* (2013.01); *H01L 23/3735* (2013.01); *H01L 2924/0002* (2013.01)

(56) References Cited

U.S. PATENT DOCUMENTS

| | | | |
|---|---|---|---|
| 6,014,312 A | | 1/2000 | Schulz-Harder et al. |
| 6,091,746 A | | 7/2000 | Le Garrec et al. |
| 6,097,744 A | | 8/2000 | Takigawa et al. |
| 6,351,384 B1 | | 2/2002 | Daikoku et al. |
| 6,386,278 B1 | | 5/2002 | Schulz-Harder |
| 7,353,859 B2 | | 4/2008 | Stevanovic et al. |
| 2003/0071581 A1 | * | 4/2003 | Panagotacos ............ F21V 5/04 |
| | | | 315/185 R |
| 2005/0016895 A1 | | 1/2005 | Glenn |
| 2005/0168950 A1 | | 8/2005 | Yoshioka et al. |
| 2009/0283244 A1 | | 11/2009 | Bezama et al. |
| 2010/0071396 A1 | * | 3/2010 | Jadric ................ H05K 7/20936 |
| | | | 62/259.2 |

FOREIGN PATENT DOCUMENTS

| | | |
|---|---|---|
| EP | 2200080 A2 | 6/2010 |
| EP | 2200080 A3 | 6/2010 |
| JP | 2006019676 A | 1/2006 |
| WO | 2008013758 A2 | 1/2008 |
| WO | 2008013758 A3 | 1/2008 |
| WO | 2010008974 A1 | 1/2010 |

\* cited by examiner

COOLING DEVICE FOR COOLING A LASER ARRANGEMENT AND LASER SYSTEM COMPRISING COOLING DEVICES

CROSS-REFERENCE TO PRIOR APPLICATIONS

This application is the U.S. National Phase application under 35 U.S.C. §371 of International Application No. PCT/EP2014/058828, filed on Apr. 30, 2014, which claims the benefit of European Patent Application No. EP13166176.1, filed on May 2, 2013. These applications are hereby incorporated by reference herein.

FIELD OF THE INVENTION

The invention relates to a cooling device for cooling a laser arrangement and a laser system comprising such cooling devices. The invention further relates to methods of manufacturing the cooling device and a laser system comprising such cooling devices.

BACKGROUND OF THE INVENTION

U.S. Pat. No. 6,014,312 discloses a cooler for use as a heat sink for electrical components or circuits consisting of several cooler layers which are joined flat to one another, which are stacked on top of one another, which form between channels through which coolant flows and which each discharge into at least one first collection space for supply of the coolant and into a second collection space for draining the coolant, the collection spaces being formed by openings in the cooler layers and the cooling channels by structuring at least one area of the coolant layers with openings, the area being between the openings.

US 2005/0168950 A1 a semiconductor cooling device including at least an upper plate, an intermediate plate and a lower plate, and has a coolant inlet portion, an outlet portion and a flow passage portion. The upper plate and the lower plate are composite plates constituted by plating copper maintaining a thickness of not smaller than 0.05 mm on one surface or on both surfaces of auxiliary plates made of a material having a tensile strength of not smaller than 1000 N/mm$^2$, a heat conductivity of not smaller than 100 W/m·K and a coefficient of thermal expansion of not larger than 6.0 ppm/° C. The semiconductor cooling device tries to prevent occurrence of distortion in the semiconductor cooling device and to prevent the semiconductor chip from being separated away from the semiconductor cooling device in case the semiconductor chip and the semiconductor cooling device are thermally expanded.

The described cooler is costly if a number of coolers have to be combined to a system. High effort is needed if the electrical components on two or more coolers need to be aligned to each other with high precision.

SUMMARY OF THE INVENTION

It's thus an object of the present invention to provide an improved cooling device for cooling a laser arrangement enabling simplified scalability of a laser system comprising at least two cooling devices. It's a further an object to provide a corresponding method of manufacturing such a cooling device and laser system.

According to a first aspect a cooling device for cooling a laser arrangement is presented. The cooling device being adapted to enable a detachable interconnection to a further cooling device. The cooling device comprises a mounting area for the laser arrangement, a cooling volume, which comprises cooling channels being arranged to cool the mounting area, a coolant inlet and a coolant outlet being connected to the cooling channels of the cooling volume, a first coolant supply through hole being connected to the coolant inlet, a second coolant supply through hole being connected to the coolant outlet. The cooling device further comprises at least one coupling element enabling the detachable interconnection to the further cooling device such that upon interconnecting the cooling device to the further cooling device, the first coolant supply through hole of the cooling device is connected to a first coolant supply through hole of the further cooling device and the second coolant supply through hole of the cooling device is connected to a second coolant supply through hole of the further cooling device. The cooling device comprises a Printed Circuit Board (PCB) or Direct Bonded Copper multilayer (DCB) comprising at least part of a driving electronics for electrically driving the laser arrangement, the Printed Circuit Board (PCB) or Direct Bonded Copper multilayer (DCB) comprising electrical connectors for enabling an electrical connection of the Printed Circuit Board (PCB) or Direct Bonded Copper multilayer (DCB) of the cooling device to a further Printed Circuit Board (PCB) or Direct Bonded Copper multilayer (DCB) of the further cooling device upon the detachable interconnection between the cooling device and the further cooling device. The cooling device is arranged in a way that a coolant can be supplied to the cooling volume via the first coolant supply through hole and the second coolant supply through hole.

The arrangement of the first and second coolant supply through hole in combination with the coupling element of the cooling device enables an easy scalability of a laser system comprising two, three, four or more cooling devices with laser arrangements mounted on the mounting areas. Furthermore, no complex water distribution plate consisting of corrosion resistant material with high precision drillings for mounting coolers has to be provided, which has to be manufactured individually thus causing high costs. The cooling device may enable laser systems of different size at reduced costs.

The electrical supply of the laser arrangement may be performed by means of, for example, PCBs comprising at least part of the driving electronics being electrically connected to the laser arrangement. The PCBs may comprise electrical connectors such that a first PCB of a first cooling device is electrically connected to a second PCB of a second cooling device as soon as the first and the second cooling device are detachably connected to each other. Alternatively, there may be through holes for electrical supply enabling an electrical connection of the laser arrangement.

A coolant proof coupling of the first and the second coolant supply through hole of the cooling devices may be enabled by providing high precision cooling devices enabling a coolant proof coupling. Alternatively or in addition a gasket like O-rings or the like may be used.

The cooling device may be especially suited for laser arrangements comprising high-power laser modules like high-power Vertical Cavity Surface Emitting Laser (VCSEL) modules. Such VCSEL-modules comprise one, two, three or more arrays of VCSEL. VCSELs can be manufactured and tested on wafer scale enabling cost effective laser modules.

The coupling element may enable a direct coupling of the cooling devices or an indirect coupling of the cooling devices. A direct coupling is enabled if no additional coupling structure is needed to couple the cooling devices wherein in case of indirect coupling at least on additional element is needed. An example of indirect coupling may be a through hole in each cooling device in parallel to the first and the second coolant supply through hole wherein the additional coupling structure may be a rod or long screw which can be inserted in the through holes such that the cooling devices can be clamped at the end of the rod. Alternatively, extensions (or recesses) may be provided perpendicular to the first and the second coolant supply through hole and a bar with holes (or extensions) fitting to the extensions (or recesses) may be provided to couple the cooling devices. The coupling element may enable a coupling of the cooling devices without a base plate comprising high precision drillings. It may also be possible to provide an additional permanent coupling between cooling devices by means of an adhesive, welding or the like.

The coupling element of the cooling device may in case of a direct coupling comprise at least one slot and at least one key. The slot and the key are arranged in a way that two cooling devices are automatically aligned as soon as both cooling devices are coupled to each other. The key may be a simple extension and the slot a recess being adapted to the shape of the key such that cooling devices coupled by means of the key and the slot cannot move with respect to each other in order to enable a perfect alignment. Key and slot may alternatively be realized as plug-in connector. Alternatively, a male cooling device may comprise only keys and a female cooling device may comprise only corresponding slots.

At least one slot may be arranged on a first side of the cooling device extending in parallel to the extension of the first and the second coolant supply through hole and at least one key may be arranged on a second side of the cooling device orientated in parallel to the extension of the first and the second coolant supply through hole. The arrangement of slot and key on the first and second side and thus opposite sides of the cooling device may enable a reliable arrangement of more than two cooling devices. In addition only one type of cooling devices is needed in order to enable scalability thus reducing costs.

The slot and the key may be arranged offset to the first and the second coolant supply through hole. Alternatively or in addition the key may be an elongation of the first and/or second coolant supply through hole on the first side of the cooling device and the slot may be a widening of the first and/or second coolant supply through hole on the second side of the cooling device. The key may be in this case a kind of tube extending in a kind of socket provided by the widening. This connection may enable a coolant proof coupling of the first and the second coolant supply through holes of adjacent cooling devices. Alternatively or in addition, an O-ring or any other kind of sealing ring may be introduced into the widening to provide a coolant proof coupling.

The coupling element comprises at least a first slot and a second slot, wherein the first slot being arranged on a first side of the cooling device extending in parallel to the extension of the first and the second coolant supply through hole and the second slot being arranged on a second side of the cooling device extending in parallel to the extension of the first and the second coolant supply through hole enabling a detachable interconnection to the second cooling device by means of a coupling structure. The slots may be widenings of the first and/or second coolant supply through hole on the first and the second side of the cooling device. In this case an additional coupling structure like a tube may be provided in order to couple the cooling devices. The tube may be inserted into the widening of adjacent cooling devices in order to provide a reliable coupling and alignment. Alternatively, slots may be provided offset to the first and the second coolant supply through hole. A coupling structure like a triangular pin, rectangular pin or the like may be provided in this case in order to enable a reliable coupling and alignment. In another embodiment a through hole may be provided in each cooling device offset to the first and the second coolant supply through hole providing the slots on both sides of the cooling structure. The additional coupling structure may be in this case a rod or long screw which can be inserted in the through holes such that the cooling devices can be clamped at the end of the rod.

The cooling device may comprise at least one protrusion for fixing the cooling device. The protrusion may be an extension of the cooling device extending perpendicular to the first and the second coolant supply through hole. The protrusion may thus also be used as coupling element. The protrusion may comprise screw holes enabling a screw connection to a coupling structure comprising elongated holes. The cooling devices may be coupled and aligned by fixing the cooling devices by means of screws fixing the cooling devices via the screw holes to the coupling structure. The coupling structure may be, for example, a rectangular bar with the same width as the protrusions such that upon placing and fixing the rectangular bar on top of the protrusions no movement of adjacent cooling devices perpendicular to the first and the second coolant supply through hole is possible. Alternatively or in addition the protrusions may be used to clamp the cooling device.

A laser system may comprise at least a first and a second cooling device with laser arrangements as VCSEL arrays mounted on the mounting areas. Two, three, four or more cooling devices may be detachably coupled by means of coupling elements. The laser system further comprises a back plate being detachably coupled to the first cooling device by means of the coupling element of the first cooling device, a front plate being detachably coupled to the second cooling device by means of the coupling element of the second cooling device and electrical connectors of the first and the second cooling device. The front plate comprises a first connector and a second connector for coolant supply. Depending on the embodiment of the cooling device an additional coupling structure as a rod, tube, bar, pin or protrusion may be needed or used to couple and align the cooling devices in a reliable way. The front plate may be a cooling device with first connector and second connector for coolant supply. The back plate may be a cooling device with plugs or the like to close the side of the first and the second coolant supply through hole on the side of the cooling device opposite to the adjacent cooling device.

The laser system may further comprise a base plate, the front plate and the back plate being detachably coupled to the base plate. The front and the end plate may be directly or indirectly coupled to the base plate. In case of a direct coupling screws or clamps may be provided at the front plate and the back plate to fix the front plate, the back plate and the cooling devices in between to the base plate. In case of an indirect coupling the cooling devices may be coupled to the base plate, for example, by means of the protrusion and clamps and/or by means of screws.

The cooling devices of the laser system may each comprise at least one electrical supply though hole extending from the base plate to the mounting area. The base plate may comprise in this case at least one slit being arranged as feed through for electrical supply and being aligned with the electrical supply though holes. The electrical supply through holes enable an individual electrical connection of each laser arrangement. One central driver would thus be sufficient to drive all laser arrangements in accordance with an applicable driving scheme.

Each cooling device of the laser system may comprise two protrusions and two side plates each with a notch for fixing the protrusions to the base plate. The side plates are detachably coupled to the base plate and/or the back plate and the front plate. The side plates may be coupled by means of screws or clamps to the base plate and/or to the front and back plate. The front and back plate may be indirectly coupled to the base plate via the side plates.

The laser system may comprise a top-cover glass for protecting the laser arrangements against the environment. The top cover glass may be detachably coupled to the back plate, the front plate and/or the side plates. The cooling structure may comprise elevations on the side of the mounting area such that a rim is provided together with the back and front plate. The top cover glass may be placed on the rim possibly with a sealing.

Alternatively, back and front plate in combination with the side plate may provide a rim around the laser arrangements for placing the top cover glass. A top-frame may be provided to clamp the top-cover glass to the base plate, the side plates and/or the front and back plate.

According to a further aspect a method of manufacturing a cooling device for cooling a laser arrangement is provided, wherein the cooling device is adapted to enable a detachable interconnection to a further cooling device. The method comprising the steps of
 providing a mounting area for the laser arrangement;
 providing a cooling volume comprising cooling channels being arranged to cool the mounting area;
 providing a coolant inlet and a coolant outlet being connected to the cooling channels of the cooling volume;
 providing a first coolant supply through hole being connected to the coolant inlet;
 providing a second coolant supply through hole being connected to the coolant outlet such that a coolant can be supplied to the cooling volume via the first coolant supply through hole and the second coolant supply through hole;
 providing at least one coupling element enabling the detachable interconnection to the further cooling device such that upon interconnecting the cooling device to the second cooling device, the first coolant supply through hole of the cooling device is connected to a first coolant supply through hole of the further cooling device and the second coolant supply through hole of the cooling device is connected to a second coolant supply through hole of the further cooling device; and
 providing a Printed Circuit Board (PCB) or Direct Bonded Copper multilayer (DCB) comprising at least a part of a driving electronics for electrically driving the laser arrangement, the Printed Circuit Board (PCB) or Direct Bonded Copper multilayer (DCB) comprising electrical connectors for enabling an electrical connection of the Printed Circuit Board (PCB) or Direct Bonded Copper multilayer (DCB) of the cooling device to a further Printed Circuit Board (PCB) or Direct Bonded Copper multilayer (DCB) of the further cooling device upon the detachable interconnection between the cooling device and the further cooling device.

The coupling element and the arrangement of the first and second coolant supply through hole enable a simplified scalability of laser systems comprising such cooling devices.

Furthermore a method of manufacturing a laser system is provided, the method comprises the steps of
 providing at least a first and a second cooling device as describe above;
 mounting laser arrangements mounted on the mounting areas;
 detachably coupling the first and the second cooling device by means of the coupling element and electrical connectors of the first and the second cooling device;
 providing a back plate;
 detachably coupling the back plate to the first cooling device;
 providing a front plate comprising a first connector and a second connector for coolant supply; and
 detachably coupling the front plate to the second cooling device.

The method may enable a scalable laser system with reduced requirements with respect to the material used for the base plate because the base plate is not used as water distribution plate. In addition an easy alignment of the cooling devices and thus the laser arrangements may be enabled by enabling to couple the cooling devices first and subsequently couple the base plate. No high precision drillings may be needed in the base plate.

It shall be understood that the cooling device of claim 1 and the method of claim 14 have similar and/or identical embodiments, in particular, as defined in the dependent claims. Furthermore, it shall be understood that the laser system of claim 8 and the method of claim 15 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a first perspective view of an embodiment of the cooling device.

FIG. 2 shows a second perspective view of the embodiment of the cooling device.

FIG. 3 shows a cross section of the embodiment of the cooling device perpendicular to the extension of the first and second coolant supply through hole.

FIG. 4 shows a first step of manufacturing an embodiment of the laser system.

FIG. 5 shows an embodiment of a back plate of the embodiment of the laser system.

FIG. 6 shows a second step of manufacturing an embodiment of the laser system.

FIG. 7 shows a third step of manufacturing an embodiment of the laser system.

FIG. 8 shows an embodiment of a front plate of the embodiment of the laser system.

FIG. 9 shows a fourth step of manufacturing an embodiment of the laser system.

FIG. 10 shows a fifth step of manufacturing an embodiment of the laser system.

FIG. 11 shows a sixth step of manufacturing an embodiment of the laser system.

Figure 12:
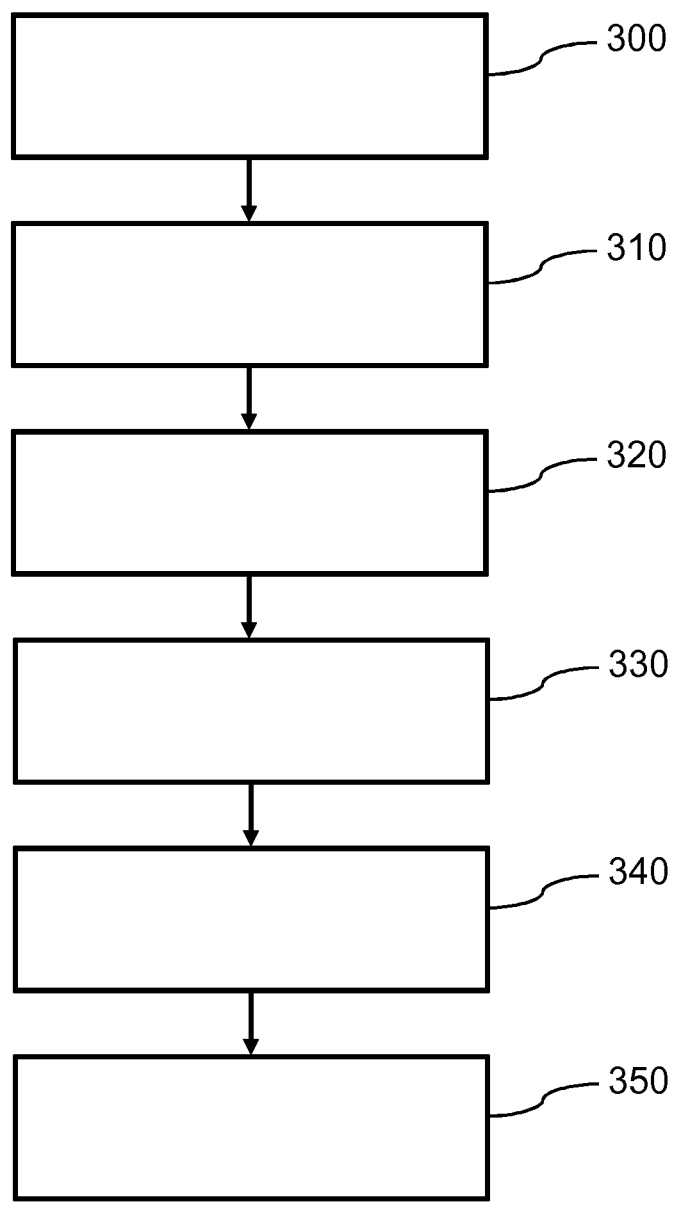

FIG. 12 shows a principal sketch of a method of manufacturing a cooling device.

Figure 13:
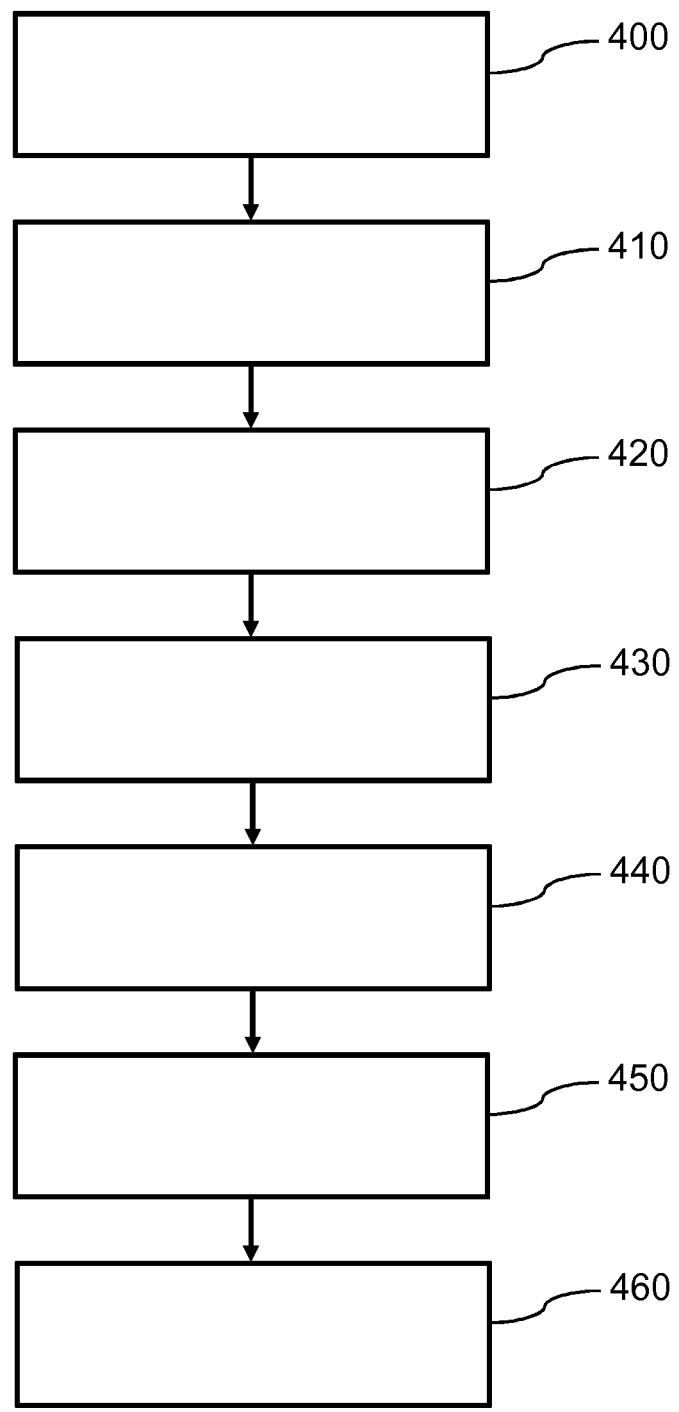

FIG. 13 shows a principal sketch of a method of manufacturing a laser system.

In the Figures, like numbers refer to like objects throughout. Objects in the Figures are not necessarily drawn to scale.

DETAILED DESCRIPTION OF EMBODIMENTS

Various embodiments of the invention will now be described by means of the figures.

Figure 1:
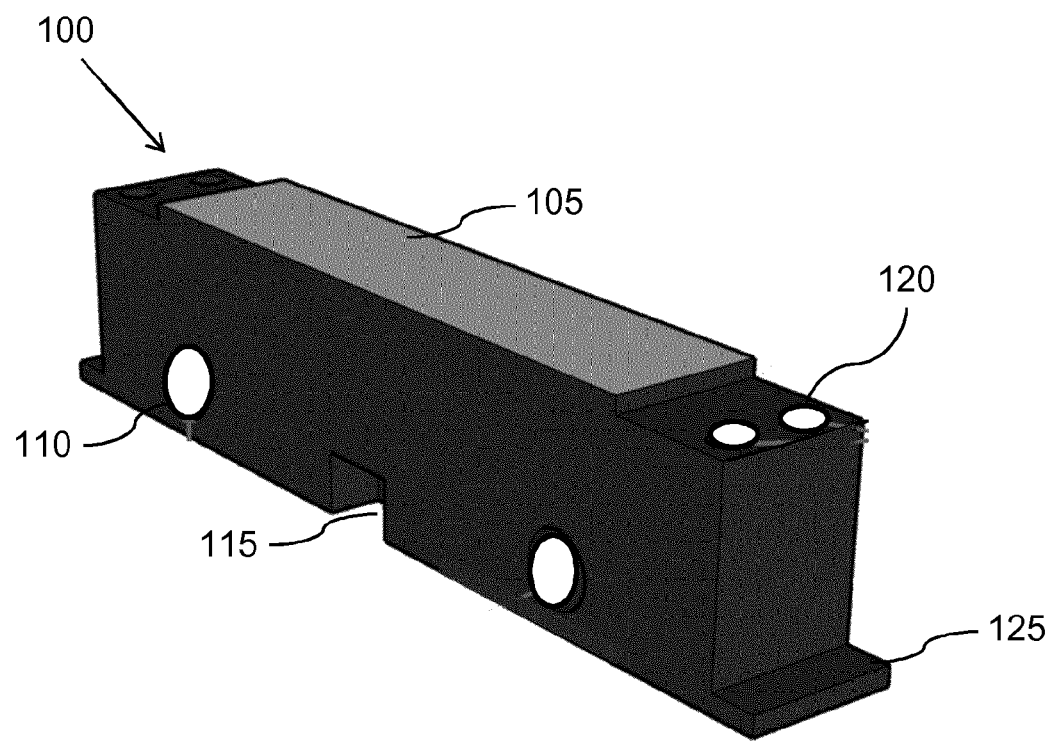

FIG. 1 shows a first perspective view of an embodiment of the cooling device. The top surface of the cooling device 100, which shall serve as mounting area 105 for the submounts, can be coated, e.g. with Au. To allow for better positioning of the submounts, this surface can also be structured, e.g. by laser-structuring.

Next to the mounting area 105 recessed areas are provided where electrically insulating PCBs or DCBs can be mounted. These serve as interface, where on the one side the external electrical lines can be connected, on the other side the bond-wires that connect to a laser arrangement like VCSEL-chips can be affixed to (the recesses shall minimize the height difference that the bond-wires have to bridge between VCSEL-chip and PCB/DCB). The 4 electrical supply through holes 120 in the corners of the recessed areas provide tunnels extending from the top adjacent to the mounting area 105 through the cooling device 100. External electrical lines can extend through the electrical supply through holes 120 enabling an individual driving of each laser arrangement by means of a central driver (not shown). The number of electrical supply through holes 120 may be adapted to the number of individually addressable VCSEL-chips or VCSEL arrays.

Figure 3:
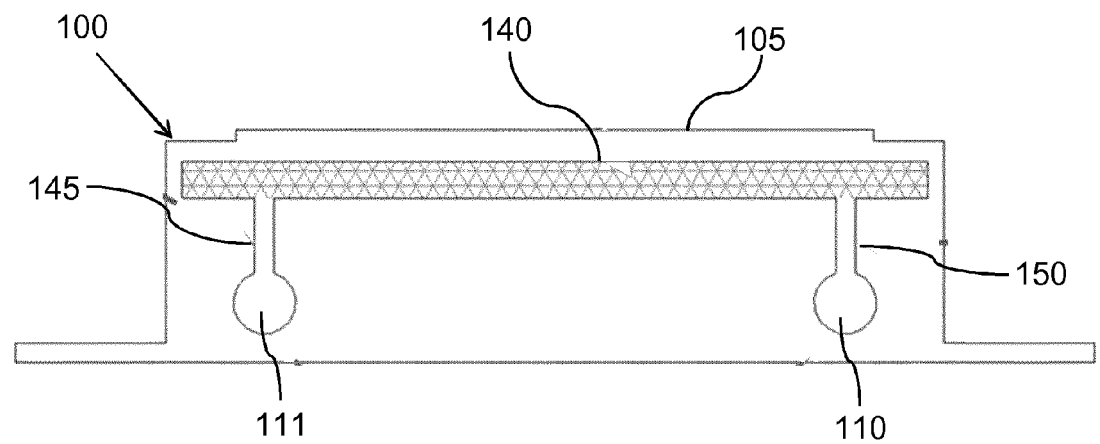

FIG. 3 shows a cross-section through the cooling device 100 depicting the internal coolant connections of the cooling device 100. The coolant (typically water) will be supplied to the cooling volume 140 being arranged as μ-channel volume (located beneath the mounting area 105) by means of a first coolant supply through hole 110 and a second coolant supply through hole 111 via a coolant inlet 150 and via a coolant outlet 145.

Towards the bottom of the cooling device 100, rectangular protrusions 125 can be seen. These are firmly connected to the cooling device 100 and enable the mechanical clamping of the cooling device 100 to a base plate (see FIGS. 4, 6, 7, 9, 10 and 11). By moving the global coolant supply to the sides of the cooling device 100, the requirements on the mechanical stability of this connection are relaxed relative to known designs. In known designs the water supply runs through the bottom of the cooler. The connections are sealed using O-rings. Therefore, the current holding mechanism not only has to mechanically fix the cooling device 100, but at the same time also to create enough compression to the O-rings to seal these water connections.

In the central part of FIG. 1, a slot 115 can be seen. This slot 115 is a recess in a first side of the body of the cooling device 100, wherein the depth of the recess is orientated or extends in parallel to the extension of the first and the second coolant supply through hole 110, 111. The slot 115 shall serve as coupling element, to adjust the positions of neighboring or adjacent cooling devices 100 relative to each other.

Figure 2:
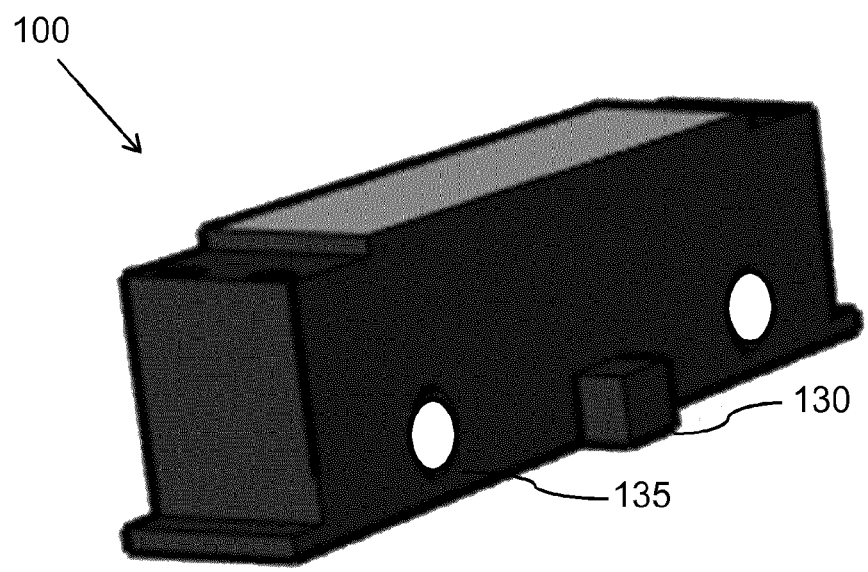

FIG. 2 shows a second perspective view of the embodiment of the cooling device. A key 130 can be seen being an extension on a second side of the body of the cooling device 100 extending in parallel to the extension of the first and the second coolant supply through hole 110, 111. The key 130 is a counterpart to the slot 115 in an adjacent cooling device. Of course, this "slot-and-key" system can be realized in a variety of ways, e.g. using alignment-pins and holes. FIG. 2 also demonstrates again how the global coolant-supply (with connection to neighboring cooling devices 100) is realized via coolant supply through holes 110, 111. Gaskets 135 may be provided between the first and the second coolant supply through holes 110, 111 of adjacent cooling devices 100. The gaskets 135 may be arranged in way that the coupling and alignment between adjacent cooling devices is improved. The cooling device 100 described above can in principle be realized using the existing technology of directly bonding a stack of (individually structured) Cu-sheets. However, it might be more economically and mechanically reasonable to combine the bonded Cu-sheet technology for the upper (μ-channel) part of the cooling device 100 with bulk-Cu components to create the global coolant-supply by means of the coolant supply through holes 110, 111 and the protrusions 125 for clamping the cooling devices at the bottom of the cooling device 100.

FIG. 3 shows a cross section of the embodiment of the cooling device perpendicular to the extension of the first and second coolant supply through hole. The meshed area at the top of the cooling device 100 in FIG. 3 is the cooling volume 140 where the μt-channels are located, to enable high heat-transfer from the VCSEL-chips to the coolant. At the bottom, the coolant supply through holes 110, 111 for the global water supply can be seen. From these through-holes, one or more coolant inlets 150 and coolant outlets 145 run (perpendicular to the axis of the through-holes) to connect the individual pt-channel volume 140 of each cooling device 100 to the global coolant supply.

Figure 4:
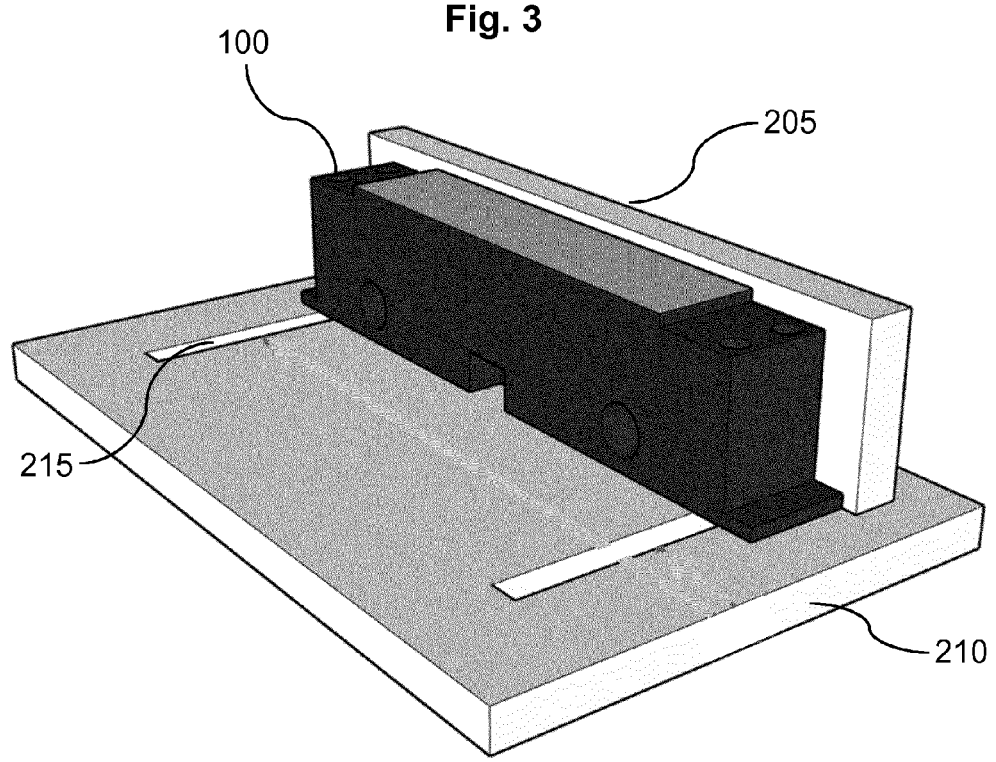
Figure 5:
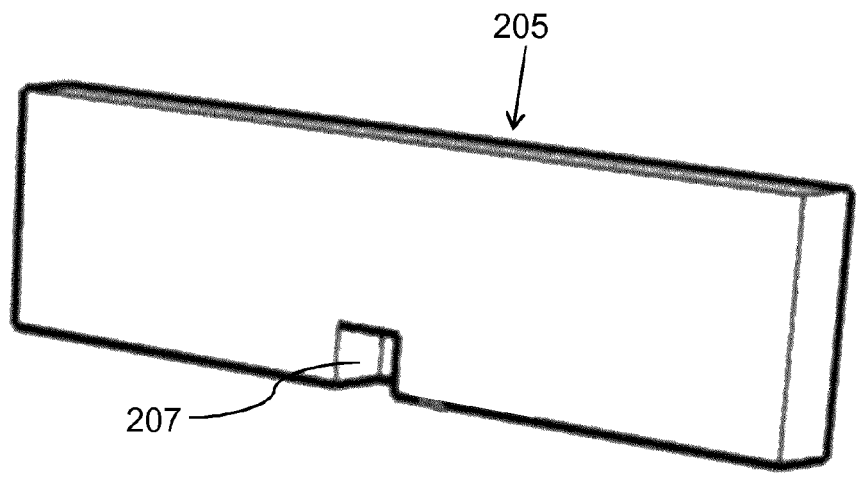

The following figures shall illustrate how this cooling device 100 concept can be used to build actual laser systems like high-power VCSEL-systems. FIG. 4 shows a first or intermediate step in assembling such a system. A back plate 205 as shown in FIG. 5 (potentially having an alignment slot 207 matching the key 130 from the adjacent cooling device 100) is fixed to a base plate 210 (with long slits 215 to feed through the external electrical lines). The base plate 210 and fixing the back plate to the base plate 210 is merely optional. The back plate 205 can be placed on any plate and clamped to one or more cooling device. In a subsequent step, the first cooling device 100 is pushed against this back plate 205 (it can be held by some intermediate means, e.g. a simple clamp). Of course, the opening of the coolant supply through holes 110, 111 have to be sealed against the back plate 205, e.g. by O-rings.

Figure 6:
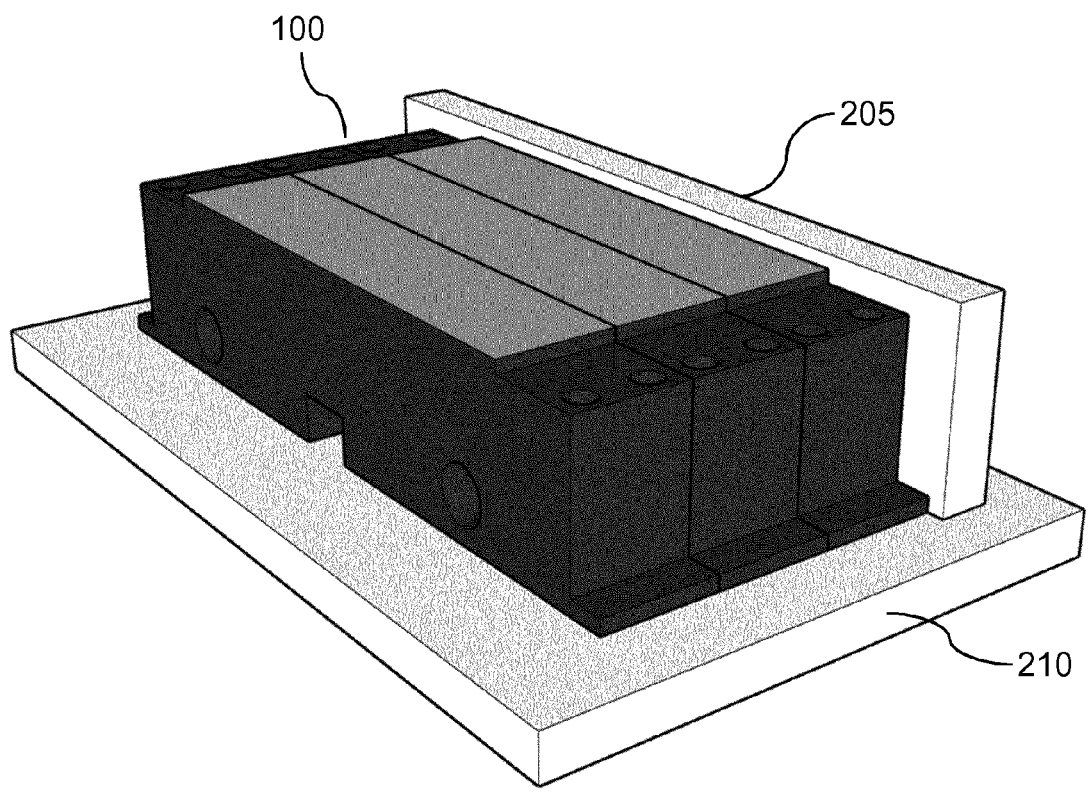

FIG. 6 shows a second intermediate step of manufacturing an embodiment of the laser system. O-ring seals or alternative means have to be provided also between all neighboring cooling devices 100 that can now be stacked in any arbitrary number next to the first cooling device 100. FIG. 6 shows an example with two additional cooling device 100s.

Figure 7:
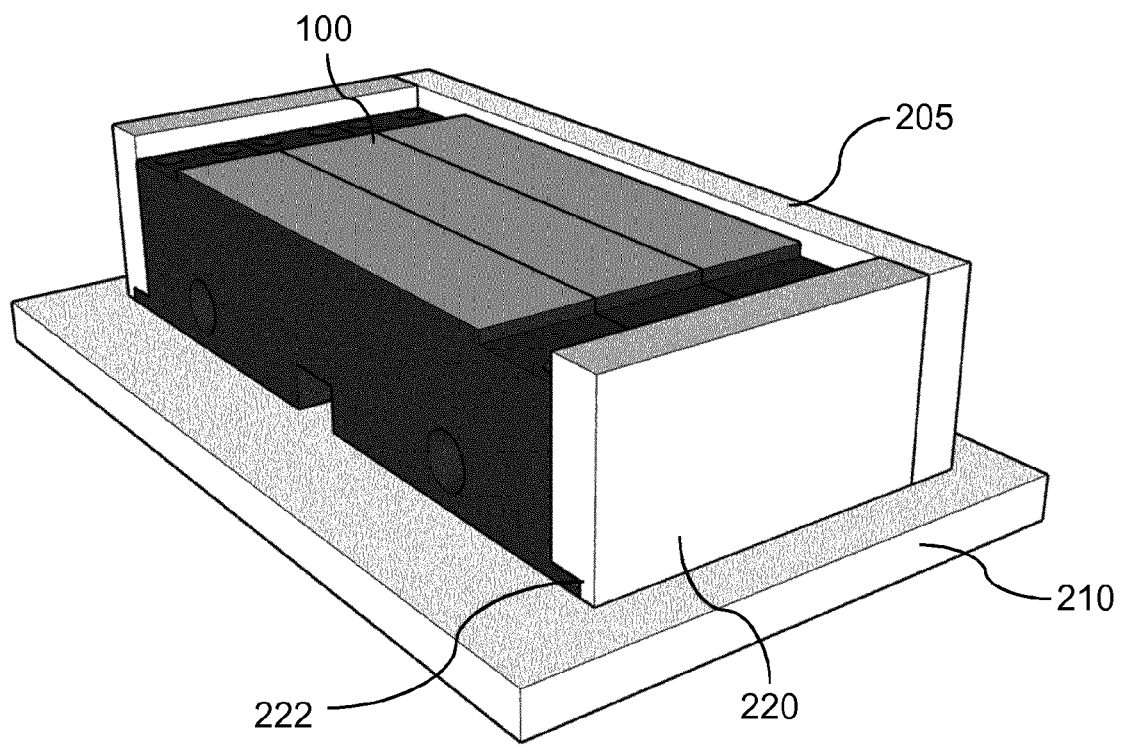

FIG. 7 shows a third intermediate step of manufacturing an embodiment of the laser system. To finally hold/clamp these cooling devices 100s in place, two side plates 220 will then be put over the protrusions 125 to the sides of the cooling devices 100. These side plates 220 can be screwed to the back plate 205 (e.g. via slit-holes, to avoid compromising the clamping). Optionally, the side plates 220 can also, e.g., be screwed to the base plate 210 outside of the cooling device 100. The latter may improve stability.

Figure 8:
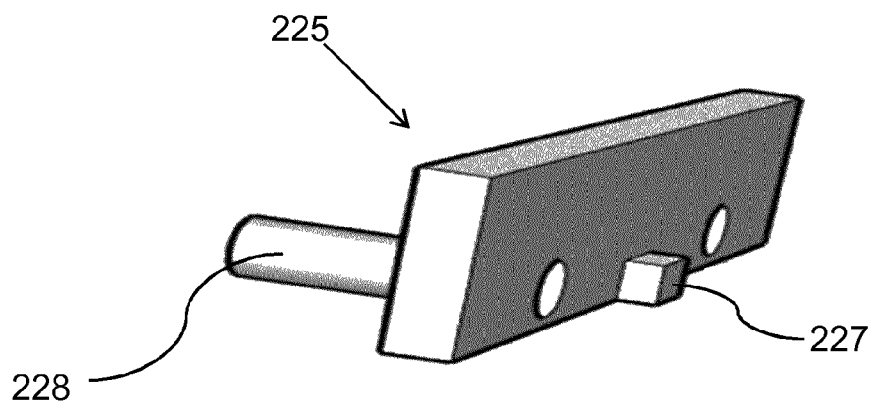

FIG. 8 shows an embodiment of a front plate of the embodiment of the laser system. The front plate comprises an optional alignment key 227 and first and second connectors 228, 229 for connecting the coolant supply to the first and second coolant supply through holes 110, 111. The first and second connector are depicted as tubes but may alternatively be, for example, holes in the front plate 225.

Figure 9:
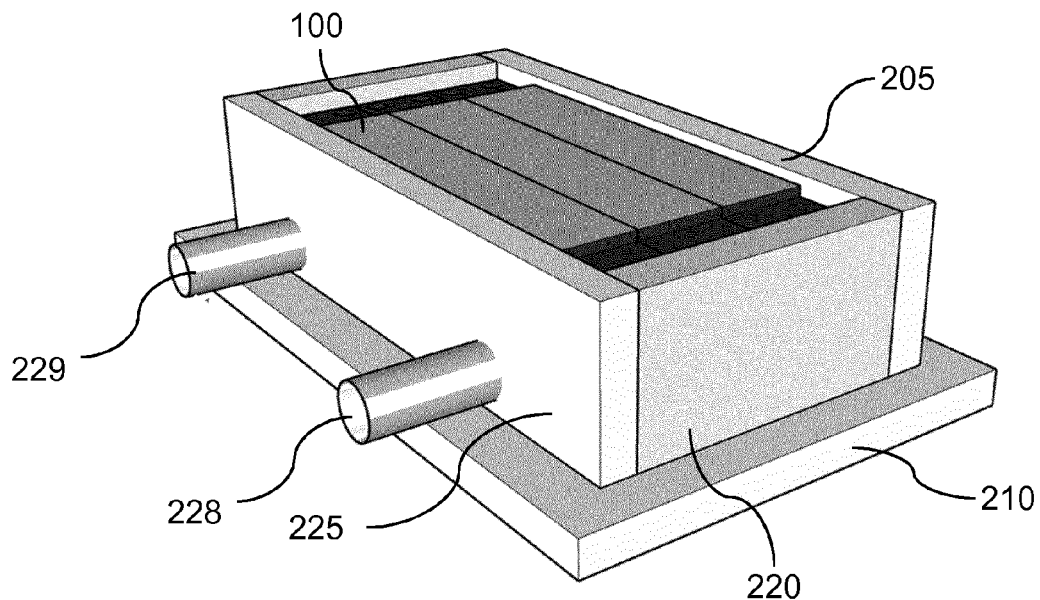

FIG. 9 shows a fourth and optionally final step of manufacturing an embodiment of the laser system. Finally, the front plate 225 encloses the cooling devices 100.

Here again, O-rings have to seal the first and second coolant supply through hole. On the front plate 225, tubes are provided as first and second connectors 228, 229 to connect the external coolant supply (e.g., hoses or tubing). To ensure good alignment of the front plate 225, it may carry a counterpart (i.e. an alignment key 227) to the slot in the last cooling device 100. It can be fixed at different positions, e.g., to the base plate 210 or side plates 220 or even with very long screws—and additional through-holes in the cooling device 100—to the back plate 205. Especially this last option should allow sufficient compression of the O-rings to yield a good sealing of the coolant lines. It's clear from FIG. 9 that the core elements of the laser system are the coupled cooling devices 100 comprising the laser arrangements. Front plate 225 and back plate 205 may be cooling devices 100 as well, which may be coupled by a coupling structure like long screws extending through additional through holes. One side of the connected first and second coolant supply through holes 110,111 may be closed by means of plugs and the external coolant supply may be connected to the other side of the laser system. Base plate 210 and side plates 220 may improve the alignment and the reliability of the laser system but are optional.

Figure 10:
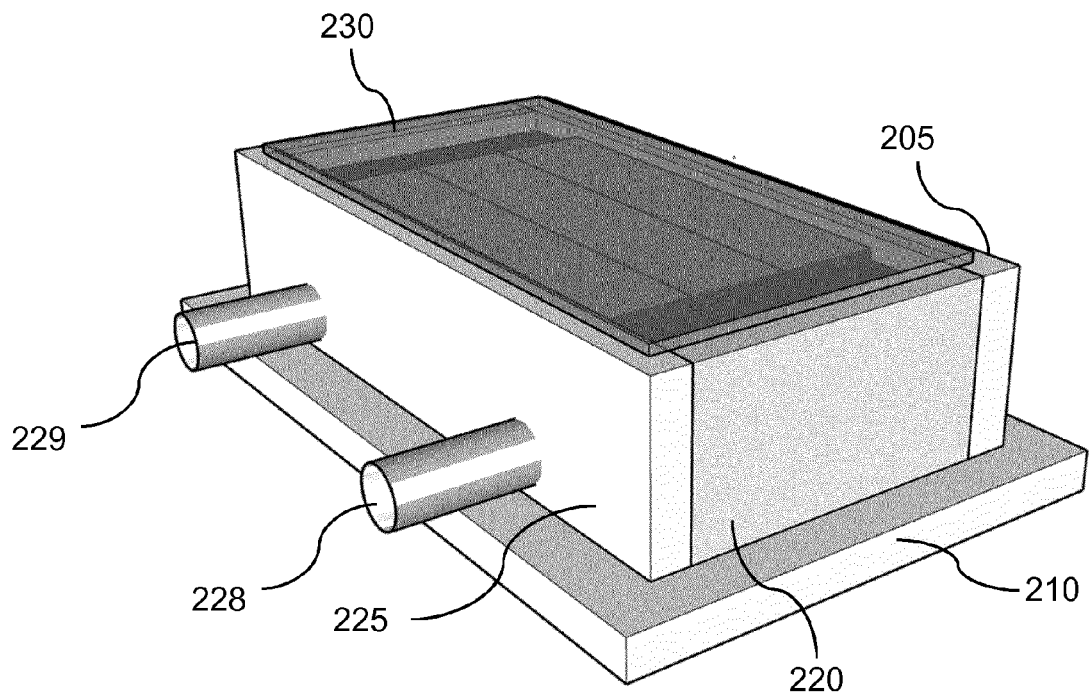
Figure 11:
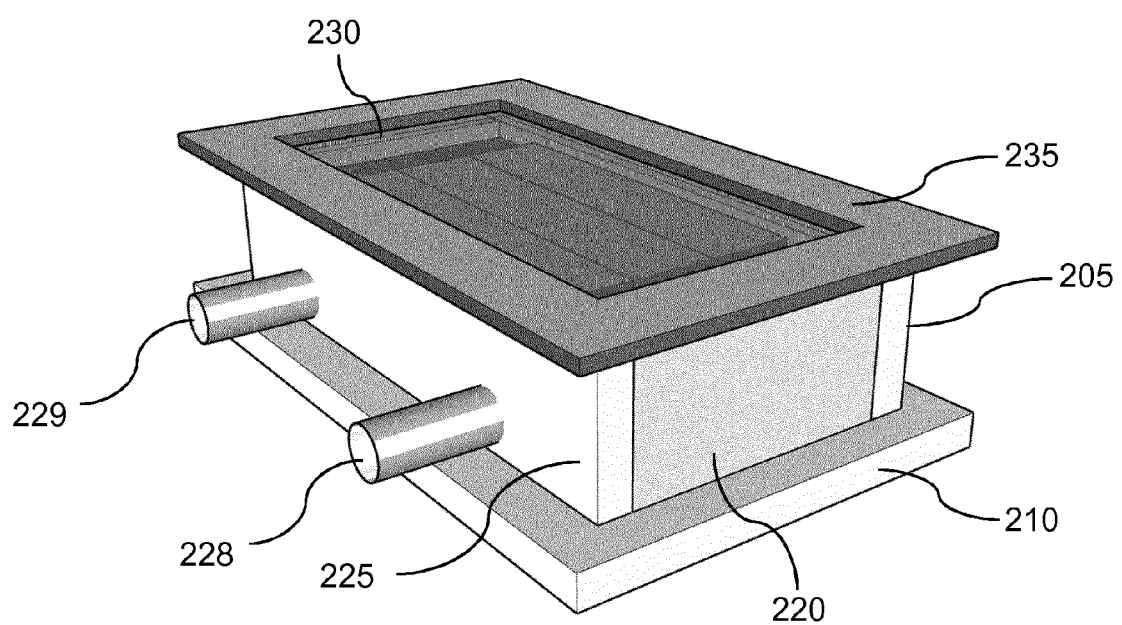

FIG. 10 shows a fifth optional step of manufacturing an embodiment of the laser system. In many applications, the lasers of the laser arrangements or to be more specific the VCSEL-chips on the cooling devices 100 shall be covered/protected against the environment by an appropriate top-cover glass 230. Sometimes, the cooling device 100 shall even be sealed air-tight, in order to avoid water condensation when the coolant temperature is below the dew-point in a particular environment. Therefore, by proper designing the height of the front plate 225, side plates 220, and back plates 205, it will be possible to directly mount a top-cover glass 230 on top of the assembly. If air-tightness is required, an O-ring can be used in between the top of the plates and the top-cover glass 230. To hold the top-cover glass 230 in place, again a clamping technique can be used as depicted in FIG. 11. The top frame 235 may be coated, e.g. with Au, depending on the application. The top frame 235 may be screwed to the front plate 225, side plates 220, and back plate 205 (if these are sufficiently thick) or even to the base plate 210 (with long screws).

Since most of the parts described above do not come into contact with the coolant circulation, the material requirements are much less stringent than in the current solution. Most of the pieces may be manufactured from (easy-to-machine) Al. Even for the plates that potentially have contact with the coolant (i.e., front- and back-plate), it may be possible to avoid this contact (e.g., by employing fixtures in the front-plate that tunnel through this plate or by using only small, thin pieces of 4VA steel in the regions where the coolant touches the back-plate).

Manufacturing and assembly of the described parts will be much easier and more straight-forward than for the current water-distribution plates. Scaling to a different number of cooling device 100 is also facilitated, since only a different length of the base plate 210 and side plates 220 is required (if needed at all), while the (a little bit more complex) front plate 225 and back plate 205 stay the same. This in turn will also help with economy of scale, since for essentially any application the same front plate 225 and back plate 205 can be used.

FIG. 12 shows a principal sketch of a method of manufacturing a cooling device for cooling a laser arrangement. In step 300 a mounting area 105 for the laser arrangement is provided. In step 310 a cooling volume 140 comprising cooling channels being arranged to cool the mounting area 105 are provided. In step 320 a coolant inlet 150 and a coolant outlet 145 being connected to the cooling channels of the cooling volume 140 are provided. In step 330 a first coolant supply through hole 110 being connected to the coolant inlet 150 is provided. In step 340 a second coolant supply through hole 111 being connected to the coolant outlet 145 such that a coolant can be supplied to the cooling volume via the first coolant supply through hole 110 and the second coolant supply through hole 111 is provided. In step 350 at least one coupling element 115, 130, 135 enabling a detachable interconnection to a second cooling device is provided such that upon interconnecting the cooling device 100 to the second cooling device, the first coolant supply through hole 110 of the cooling device 100 is connected to a first coolant supply through hole of the second cooling device and the second coolant supply through hole 111 of the cooling device 100 is connected to a second coolant supply through hole of the second cooling device.

FIG. 13 shows a principal sketch of a method of manufacturing a laser system. In step 400 at least two cooling devices 100 for cooling a laser arrangement are provided. The cooling devices 100 comprises mounting areas 105 for laser arrangements, a cooling volume 140 comprising cooling channels being arranged to cool the mounting area 105, a coolant inlet 150 and a coolant outlet 145 being connected to the cooling channels of the cooling volume 140, a first coolant supply through hole 110 being connected to the coolant inlet 150, a second coolant supply through hole 111 being connected to the coolant outlet 145. The cooling devices further comprise at least one coupling element 115, 130, 135 enabling a detachable interconnection of the two cooling devices 100 such that upon interconnecting the cooling devices 100, the first coolant supply through hole 110 of a first cooling device 100 being connected to a first coolant supply through hole of a second cooling device and the second coolant supply through hole 111 of the first cooling device 100 being connected to a second coolant supply through hole of the second cooling device, wherein the cooling devices 100 being arranged in a way that a coolant can be supplied to the cooling volume via the first coolant supply through hole 110 and the second coolant supply through hole 111. In step 410 laser arrangements are mounted on the mounting areas 105. In step 420 the at least two cooling devices 100 are detachably coupled by means of the coupling element 115, 130, 135. In step 430 a back plate 205 is provided and in step 440 detachably coupled the back plate 205 to a first cooling device 100. In step 450 a front plate 225 comprising a first connector 228 and a second connector 229 for coolant supply is provided. In step 460 the front plate 225 is detachably coupled to a second cooling device 100 by means of the coupling element 115, 130, 135 of the second cooling device 100.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 cooling device
105 mounting area
110 first coolant supply through hole
111 second coolant supply through hole
115 slot
120 electrical supply through hole
125 protrusion
130 key
135 gasket
140 cooling volume
145 coolant outlet
150 coolant inlet
205 back plate
207 alignment slot
210 base plate
215 slit
220 side plate
222 notch
225 front plate
227 alignment key
228 first connector
229 second connector
230 top-cover glass
235 top frame
300 step of providing a mounting area for the laser arrangement
310 step of providing a cooling volume comprising cooling channels being arranged to cool the mounting area
320 step of providing a coolant inlet and a coolant outlet being connected to the cooling channels of the cooling volume
330 step of providing a first coolant supply through hole being connected to the coolant inlet
340 step of providing a second coolant supply through hole being connected to the coolant outlet such that a coolant can be supplied to the cooling volume via the first coolant supply through hole and the second coolant supply through hole
350 step of providing at least one coupling element enabling a detachable interconnection to a second cooling device such that upon interconnecting the cooling device to the second cooling device, the first coolant supply through hole of the cooling device being connected to a first coolant supply through hole of the second cooling device and the second coolant supply through hole of the cooling device being connected to a second coolant supply through hole of the second cooling device
400 providing at least two cooling devices
410 mounting laser arrangements mounted on the mounting areas
420 detachably coupling the at least two cooling devices being coupled by means of the coupling element
430 providing a back plate
440 detachably coupling the back plate to a first cooling device be means of the coupling element of the first cooling device
450 providing a front plate comprising a first connector and a second connector for coolant supply
460 detachably coupling the front plate to a second cooling device by means of the coupling element of the second cooling device

The invention claimed is:

1. A cooling device for cooling a laser arrangement, the cooling device being adapted to enable a detachable interconnection to a further cooling device, the cooling device comprising,
a mounting area for the laser arrangement;
a cooling volume comprising cooling channels being-arranged to cool the mounting area;
a coolant inlet and a coolant outlet connected to the cooling channels of the cooling volume,
a first coolant supply through hole connected to the coolant inlet;
a second coolant supply through hole connected to the coolant outlet;
at least one coupling element enabling the detachable interconnection to the further cooling device such that upon interconnecting the cooling device to the further cooling device, the first coolant supply through hole of the cooling device is connected to a first coolant supply through hole of the further cooling device and the second coolant supply through hole of the cooling device is connected to a second coolant supply through hole of the further cooling device, wherein a coolant can be supplied to the cooling volume via the first coolant supply through hole and the second coolant supply through hole; and
at least one recessed area, adjacent the mounting area for the laser arrangement, for mounting a Printed Circuit Board or a Direct Bonded Copper multilayer comprising at least a part of driving electronics for electrically driving the laser arrangement, each of the at least one recessed area defining at least one electrical supply through hole, for enabling electrical lines to pass through the cooling device and connect to the Printed Circuit Board or the Direct Bonded Copper multilayer, wherein the Printed Circuit Board or the Direct Bonded Copper multilayer comprises electrical connectors for enabling an electrical connection of the Printed Circuit Board or the Direct Bonded Copper multilayer of the cooling device to a further Printed Circuit Board or Direct Bonded Copper multilayer of the further cooling device upon the detachable interconnection between the cooling device and the further cooling device.

2. The cooling device according to claim 1, wherein the at least one coupling element comprises at least one slot and at least one key.

3. The cooling device according to claim 2, wherein the at least one slot is arranged on a first side of the cooling device extending in parallel to an extension of the first and the second coolant supply through holes, and the at least one key is arranged on a second side of the cooling device extending in parallel to the extension of the first and the second coolant supply through holes.

4. The cooling device according to claim 2, wherein the at least one slot and the at least one key are offset from each of the first coolant supply through hole and the second coolant supply through hole.

5. The cooling device according to claim 2, wherein the at least one key is an elongation of the first coolant supply through hole and/or the second coolant supply through hole on the first side of the cooling device and the at least one slot is a widening of the first colorant supply through hole and/or the second coolant supply through hole on a second side of the cooling device.

6. The cooling device according to claim 1, wherein the at least one coupling element comprises a first slot and a second slot, wherein the first slot is arranged on a first side of the cooling device extending in parallel to an extension of the first coolant supply through hole and the second coolant supply through hole, and the second slot is arranged on a second side of the cooling device extending in parallel to the extension of the first coolant supply through hole and the second coolant supply through hole, enabling the detachable interconnection to the further cooling device by means of a coupling structure.

7. The cooling device according to claim 1, further comprising at least one protrusion for fixing the cooling device to a base plate.

8. A laser system comprising:
at least a first cooling device and a second cooling device according to claim 1, the second cooling device being detachably coupled to the first cooling device by means of a coupling element and electrical connectors of the first and the second cooling devices, respectively;
first and second laser arrangements mounted on mounting areas of the first and second cooling devices, respectively;
a back plate detachably coupled to the first cooling device; and
a front plate detachably coupled to the second cooling device, the front plate comprising a first connector and a second connector for coolant supply.

9. The laser system according to claim 8, further comprising a base plate, the front plate and the back plate being detachably coupled to the base plate.

10. The laser system according to claim 9, wherein each of the first and second cooling devices comprise at least one electrical supply though hole extending from the base plate to the mounting area, the base plate comprising at least one slit being arranged as feed through for electrical supply and being aligned with the electrical supply though holes.

11. The laser system according to claim 9, wherein each of the first and second cooling devices two protrusions, wherein the laser system further comprises two side plates each with a notch for fixing the protrusions to the base plate, the side plates being detachably coupled to the base plate and/or the back plate and/or the front plate.

12. The laser system according to claim 11, further comprising a top-cover glass for protecting the first and second laser arrangements against the environment, the top cover glass being detachably coupled to the back plate, the front plate and/or the side plates.

13. The laser system according to claim 12, further comprising a top frame for clamping the top-cover glass.

14. The cooling device according to claim 1, wherein the at least one electrical supply though hole extends from the mounting area to a base plate, to which the cooling device is attached, the base plate comprising at least one slit arranged as feed through for the electrical lines and aligned with the at least one electrical supply though hole.

15. A method of manufacturing a cooling device for cooling a laser arrangement, the cooling device being adapted to enable a detachable interconnection to a further cooling device, the method comprising:
providing a mounting area for the laser arrangement;
providing a cooling volume comprising cooling channels being arranged to cool the mounting area;
providing a coolant inlet and a coolant outlet being connected to the cooling channels of the cooling volume;
providing a first coolant supply through hole connected to the coolant inlet;
providing a second coolant supply through hole connected to the coolant outlet enabling a coolant to be supplied to the cooling volume via the first coolant supply through hole and the second coolant supply through hole;
providing at least one coupling element enabling the detachable interconnection to the further cooling device such that upon interconnecting the cooling device to the second cooling device, the first coolant supply through hole of the cooling device being connectable to a first coolant supply through hole of the further cooling device and the second coolant supply through hole of the cooling device being connectable to a second coolant supply through hole of the further cooling device;
providing at least one recessed area for mounting a Printed Circuit Board or a Direct Bonded Copper multilayer comprising at least a part of a driving electronics for electrically driving the laser arrangement, the Printed Circuit Board or Direct Bonded Copper multilayer comprising electrical connectors for enabling an electrical connection of the Printed Circuit Board or the Direct Bonded Copper multilayer of the cooling device to a further Printed Circuit Board or Direct Bonded Copper multilayer of the further cooling device upon the detachable interconnection between the cooling device and the further cooling device; and
providing at lea one electrical supply though hole in each of the at least one recessed area for enabling electrical lines to pass through the cooling device and connect to the Printed Circuit Board or the Direct Bonded Copper multilayer.

16. A laser system, comprising:
a plurality of cooling devices adapted to enable detachable interconnections between cooling devices of the plurality of cooling devices; and
a plurality of laser arrangements corresponding to the plurality of cooling devices;
a base plate supporting the plurality of cooling devices;
a front plate and a back plate coupled to the base plate; and
side plates coupled to at least one of the base plate, the front plate and the back plate, each side plate having a notch adjacent the base plate;
wherein each cooling device of the plurality of cooling devices comprises:
a mounting area for mounting the corresponding laser arrangement;
a cooling volume comprising cooling channels arranged to cool the mounting area;

a coolant inlet and a coolant outlet connected to the cooling channels of the cooling volume;

a first coolant supply through hole connected to the coolant inlet;

a second coolant supply through hole connected to the coolant outlet;

at least one coupling element enabling the detachable interconnection to at least one other cooling device of the plurality of cooling devices, such that upon interconnecting the cooling device to the at least one other cooling device, the first coolant supply through hole of the cooling device connects to a first coolant supply through hole of the at least one other cooling device, and the second coolant supply through hole of the cooling device is connected to a second coolant supply through hole of the at least one other cooling device, enabling a coolant to be supplied to the cooling volume via the first coolant supply through hole and the second coolant supply through hole;

protrusions adapted to fit into the notches in the side plates, fixing the protrusions to the base plate; and a Printed Circuit Board or a Direct Bonded Copper multilayer comprising at least a part of driving electronics for electrically driving the corresponding laser arrangement.

17. The laser system of claim 16, wherein the Printed Circuit Board or the Direct Bonded Copper multilayer comprises electrical connectors for enabling an electrical connection of the Printed Circuit Board or the Direct Bonded Copper multilayer of the cooling device to a Printed Circuit Board or a Direct Bonded Copper multilayer of the at least one other cooling device upon the detachable interconnection between the cooling device and the at least one other cooling device.

18. The laser system according to claim 16, further comprising:

a top-cover glass for protecting the plurality of laser arrangements against the environment, the top cover glass being detachably coupled to the back plate, the front plate and/or the side plates.

19. The laser system according to claim 18, further comprising:

a top frame for clamping the top-cover glass.

* * * * *